(12) United States Patent
Bale et al.

(10) Patent No.: US 8,697,504 B2
(45) Date of Patent: Apr. 15, 2014

(54) ORGANIC THIN FILM TRANSISTORS, ACTIVE MATRIX ORGANIC OPTICAL DEVICES AND METHODS OF MAKING THE SAME

(75) Inventors: Mark Bale, Wells (GB); Craig Murphy, Teddington (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 12/808,086

(22) PCT Filed: Dec. 17, 2008

(86) PCT No.: PCT/GB2008/004138
§ 371 (c)(1),
(2), (4) Date: Aug. 26, 2010

(87) PCT Pub. No.: WO2009/077740
PCT Pub. Date: Jun. 25, 2009

(65) Prior Publication Data
US 2010/0314614 A1 Dec. 16, 2010

(30) Foreign Application Priority Data
Dec. 19, 2007 (GB) .................................. 0724774.5

(51) Int. Cl.
*H01L 21/8232* (2006.01)
(52) U.S. Cl.
USPC ............... 438/158; 438/99; 438/585; 257/40; 257/E21.414; 257/E21.226
(58) Field of Classification Search
USPC .............. 438/99, 158, 585; 257/40, E21.414, 257/E21.226
See application file for complete search history.

(56) References Cited

U.S. PATENT DOCUMENTS

| | | | |
|---|---|---|---|
| 6,905,906 B2* | 6/2005 | Sirringhaus et al. ............ | 438/99 |
| 2005/0003640 A1* | 1/2005 | Ushiyama et al. ............. | 438/502 |
| 2005/0059193 A1* | 3/2005 | Yoneya ......................... | 438/151 |
| 2005/0151195 A1* | 7/2005 | Kawase et al. ................ | 257/347 |
| 2005/0196969 A1* | 9/2005 | Gunner et al. ................ | 438/725 |
| 2006/0033105 A1* | 2/2006 | Fujii et al. ...................... | 257/66 |
| 2006/0102894 A1 | 5/2006 | Masuda et al. | |
| 2006/0194444 A1* | 8/2006 | Li et al. ......................... | 438/758 |
| 2006/0220022 A1 | 10/2006 | Moriya | |
| 2006/0267003 A1 | 11/2006 | Suh et al. | |

(Continued)

FOREIGN PATENT DOCUMENTS

| | | |
|---|---|---|
| GB | 2 461 670 | 1/2010 |
| JP | 2005-150640 A | 6/2005 |

(Continued)

OTHER PUBLICATIONS

International Preliminary Report on Patentability for Application No. PCT/GB2008/004138, dated Jun. 22, 2010.

(Continued)

*Primary Examiner* — Steven J Fulk
(74) *Attorney, Agent, or Firm* — Marshall, Gerstein & Borun LLP (57) ABSTRACT

A method of manufacturing an organic thin film transistor, comprising: providing a substrate comprising source and drain electrodes defining a channel region; subjecting at least the channel region to a cleaning treatment step; and depositing organic semiconductive material from solution into the channel region by inkjet printing.

20 Claims, 5 Drawing Sheets

(56) References Cited

U.S. PATENT DOCUMENTS

| | | | |
|---|---|---|---|
| 2006/0286704 A1* | 12/2006 | Hirai et al. | 438/34 |
| 2007/0090362 A1* | 4/2007 | Ahn et al. | 257/66 |
| 2007/0134832 A1 | 6/2007 | Oh et al. | |
| 2007/0148564 A1 | 6/2007 | Iketa et al. | |
| 2007/0290229 A1* | 12/2007 | Choi et al. | 257/192 |
| 2008/0029833 A1* | 2/2008 | Li | 257/410 |

FOREIGN PATENT DOCUMENTS

| | | |
|---|---|---|
| JP | 2006-332645 A | 12/2006 |
| JP | 2007-165889 A | 6/2007 |
| JP | 2007-173085 A | 7/2007 |
| JP | 2007-305802 A | 11/2007 |
| WO | WO-01/46987 A2 | 6/2001 |
| WO | WO 2006051457 A1 * | 5/2006 |

OTHER PUBLICATIONS

International Search Report for PCT/GB2008/004138 dated May 29, 2009.

Examination Report for Application No. GB1010046.9, dated Feb. 1, 2011.

* cited by examiner

ORGANIC THIN FILM TRANSISTORS, ACTIVE MATRIX ORGANIC OPTICAL DEVICES AND METHODS OF MAKING THE SAME

FIELD OF INVENTION

The present invention relates to organic thin film transistors, active matrix organic optical devices and methods of making the same.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and injecting holes or electrodes.

For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance. Ambipolar devices that can function as n or p-type are also known.

Transistors can be formed by depositing the components in thin films to form a thin film transistor (TFT). When an organic material is used as the semi-conductive material in such a device, it is known as an organic thin film transistor (OTFT).

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulting material disposed between the gate electrode and the semi-conductive material in the channel region.

OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

Figure 1:
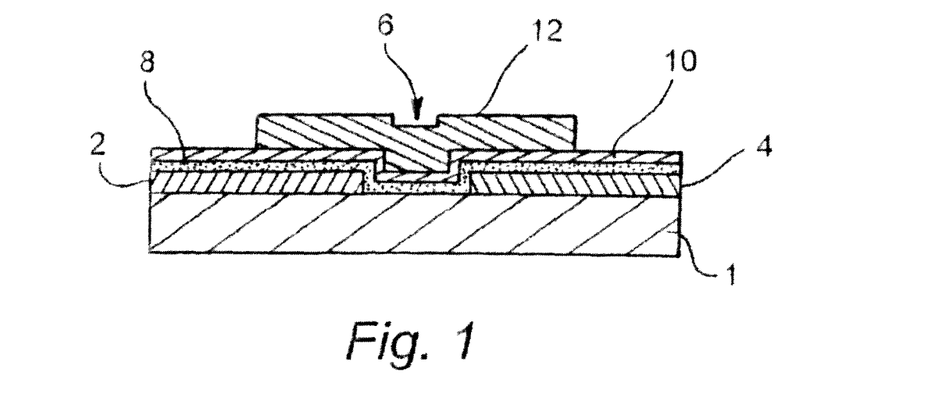
FIG. 1 shows a known top-gate organic thin film transistor arrangement.

An example of such an organic thin film transistor is shown in FIG. 1. The illustrated structure may be deposited on a substrate 1 and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

Figure 2:
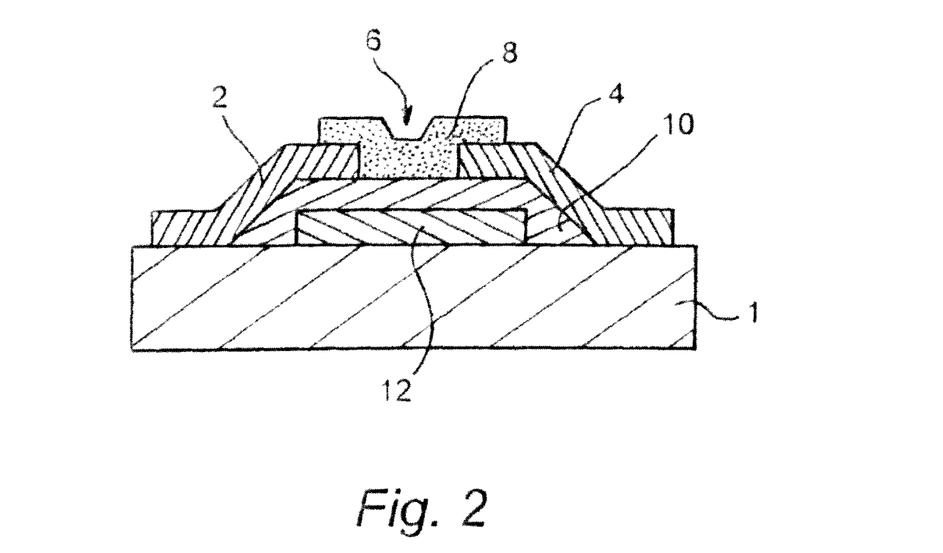
FIG. 2 shows a known bottom-gate organic thin film transistor arrangement.

An example of such a bottom-gate organic thin film transistor is shown in FIG. 2. In order to more clearly show the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

Figure 3:
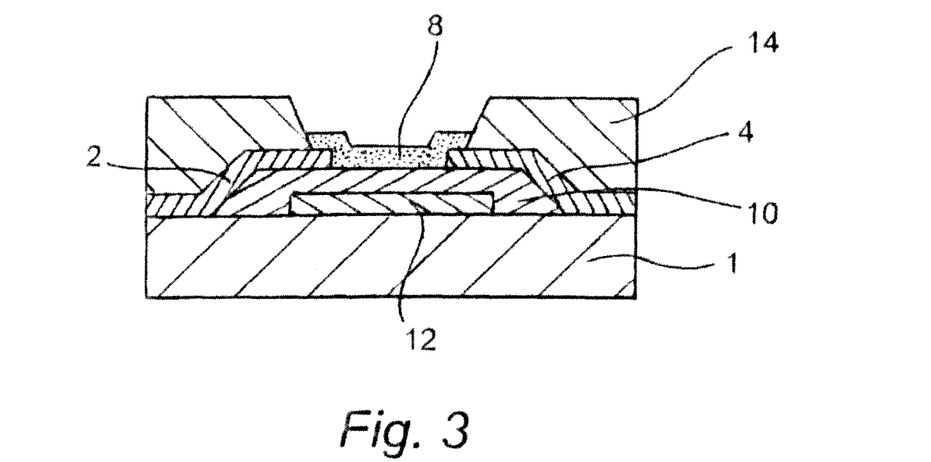
FIG. 3 shows a bottom-gate organic thin film transistor arrangement with a well for containing the organic semiconductor.
Figure 4:
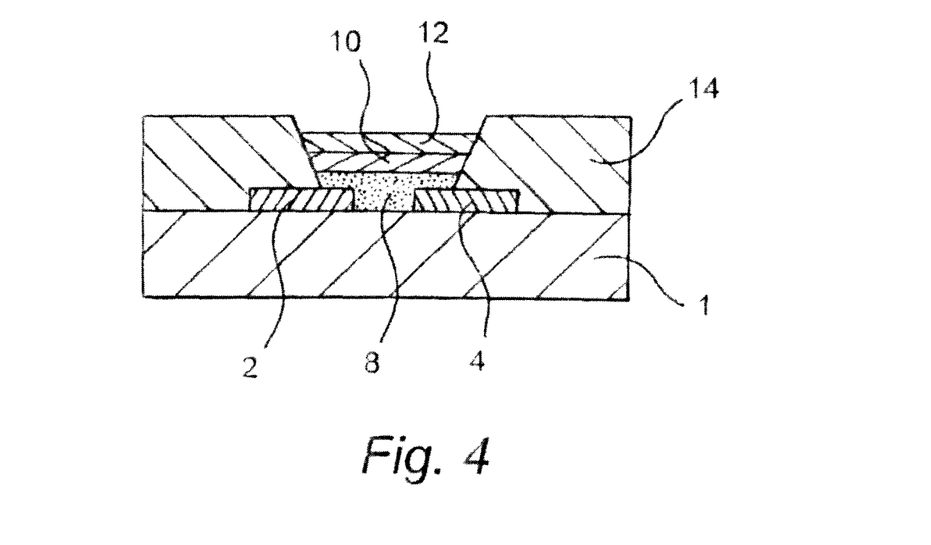
FIG. 4 shows a top-gate organic thin film transistor arrangement with a well for containing the organic semiconductor.

One problem with the aforementioned arrangements is how to contain the OSC within the channel region when it is deposited. A solution to this problem is to provide a patterned layer of insulating bank material 14 defining a well in which the OSC 8 can be deposited from solution by, for example, inkjet printing. Such an arrangement is shown in FIGS. 3 and 4 for bottom and top gate organic thin film transistor respectively. Again, in order to more clearly show the relationship between the structures illustrated in FIGS. 1 and 2, with those illustrated in FIGS. 3 and 4, like reference numerals have been used for corresponding parts.

In particular, the periphery of the well defined by patterned layer of insulating material 14 surrounds some or all of the channel 6 defined between the source and drain electrodes 2, 4 in order to facilitate deposition of the OSC 8, for example, by inkjet printing. Furthermore, as the insulating layer 14 is deposited prior to deposition of the OSC 8, it may be deposited and patterned without damaging the OSC. The structure of the insulating layer 14 can be formed in a reproducible manner using known deposition and patterning techniques such as photolithography of positive or negative resists, wet etching, dry etching, etc.

The present applicant has found that even if a patterned layer of well-defining bank material is provided, problems still exist in containing the OSC within the channel region and providing good film formation of the OSC in the channel region using solution processing techniques for deposition of the OSC. Uncontrollable wetting of the well-defining bank material occurs since the contact angle of organic solvents in which the OSC is typically deposited is low. In the worst case the OSC may overspill the well.

It is known that the wettability can be controlled by the application of surface treatment steps such as plasma treatments. However, it is also known that such surface treatments can damage the active layers of the OTFT exposed in the well. For example, it is known that exposure of gate dielectric to plasma treatments can damage the dielectric. In fact, the present applicant has conducted their own experiments to confirm that this was the case by forming bottom-gate OTFT devices as illustrated in FIG. 2 wherein the dielectric layer was exposed to a plasma treatment prior to depositing the organic semiconductor material from solution using a spin-coating technique. The performance of these devices was compared with corresponding devices in which no plasma treatment was applied to the dielectric during manufacture. The results clearly indicated that the performance of OTFT devices in which the dielectric had been exposed to a plasma treatment during manufacture was severely degraded. As such, the present applicant developed a technique in which a protective "plug" was deposited over the dielectric prior to plasma treatment in order to protect the dielectric layer from damage.

Another problem with the aforementioned arrangements is how to provide good charge carrier mobility in the organic semiconductor material. The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the device (channel between the source and drain electrodes). Thus, in order to achieve high drain currents with low operational voltages, organic thin film transistors must have an organic semiconductor which has highly mobile charge carriers in the channel region.

The application of organic thin film transistors is currently limited by the relatively low mobility of organic semiconductor materials. It has been found that one of the most effective means of improving mobility is to encourage the organic material to order and align. This minimizes intermolecular spacing and encourages inter-chain hopping which is the predominant conduction mechanism in organic semiconductors. The highest mobility organic semiconductor materials in thin film transistors show substantial ordering and crystallization, which is evident from optical micography and X-ray spectroscopy.

It is an aim of embodiments of the present invention to address the problems outlined above. In particular, it is an aim of certain embodiments to improve charge mobility in the organic semiconductor layer of an OTFT and also improve containment and film formation of the organic semiconductor material when deposited from solution.

SUMMARY OF THE INVENTION

The present applicant naturally assumed that surface treatments such as the plasma treatments discussed in the background section would have the same detrimental effects on active components of an OTFT regardless of the technique used to deposit the organic semiconductor material. As such, when the applicant changed from a spin-coating technique as described in the background section to an inkjet deposition technique for the organic semiconductor material they continued to us a protective plug in order to protect the underlying dielectric layer during plasma treatment. However, the applicant has now found that surprisingly, when an inkjet printing technique is used for depositing the organic semiconductor material, OTFT device performance is actually dramatically improved by exposing the underlying layers to a cleaning treatment step, such as a plasma treatment, prior to inkjet printing the organic semi-conductor material thereon. That is, in contrast to spin-coated devices, it has been found that applying a cleaning treatment step, such as a plasma treatment, to the channel region of an OTFT prior inkjet printing of the organic semiconductor actually dramatically improves device performance when compared with inkjet printed devices in which the underlying surface in the channel region is not so exposed.

In light of the above, and in accordance with an embodiment of the present invention there is provided a method of manufacturing an organic thin film transistor, comprising: providing a substrate comprising source and drain electrodes defining a channel region; subjecting at least the channel region to a cleaning treatment step; and depositing organic semiconductive material from solution into the channel region by inkjet printing.

It is well known that the film forming properties of inkjet printed layers is significantly different to that of layers deposited by other techniques such as spin-coating. Previously, OTFT devices manufactured using inkjet printing techniques for depositing the organic semiconductive material had shown poor performance when compared with devices manufactured using other deposition techniques for the organic semiconductive material such as spin coating. In particular, is had been found that inkjet printed organic semiconductive films have lower charge mobility. Without wishing to be bound by any theory, it is believed that the cleaning treatment step of the present invention affects the surface energy in the channel region such that wetting of an inkjet printed organic semiconductive material is improved to such an extent that damage to the surface of the channel region is more than offset. In fact, it has been found that charge mobility can be increased by at least two orders of magnitude when compared with the charge mobility of inkjet printed OTFT devices in which the surface of the channel region is not exposed to a cleaning treatment step prior to inkjet deposition of the organic semiconductive material. Such an effect is not observed for spin-coated devices, presumably due to the different film forming properties of spin-coated layers.

Preferably, at least portions of the source and drain electrodes are also exposed to the cleaning treatment step. This removes any material contaminating the surface of the electrodes which would otherwise inhibit charge injection/extraction. It also aids in the subsequent formation of an overlying self-assembled monolayer on the electrodes if one is desired for improving charge injection/extraction. The formation of such a layer is inhibited by the presence of material contaminating the surface of the electrodes.

Preferably the cleaning treatment step is a plasma treatment step, most preferably an $O_2$ plasma treatment step. It has been found that plasma treatments, and in particular $O_2$ plasma treatments, are particularly effective at increasing the charge mobility in a subsequently deposited inkjet printed organic semiconductive layer. The plasma may comprise both $O_2$ and a radical promoting species such as a halogen containing, preferably fluorine containing, species, e.g. $CF_4$.

Preferably the plasma treatment should be of high enough energy to remove any contamination but preferably low enough that the exposed surface is not overly damaged. In practice, some damage to the exposed surface may well be desired to provide crystallization sites for the organic semiconductive material. However, excessive damage to the exposed surface is not desired. Similarly, the time of exposure will also determine the extent to which an exposed surface is cleaned/damaged. Preferably, the plasma treatment should last at least 60 seconds.

Preferably the cleaning treatment step is followed by a de-wetting treatment step prior to inkjet printing of the organic semiconductive material. Preferably, the de-wetting treatment is a plasma treatment such as a halogen containing, preferably fluorine containing, plasma, e.g. $CF_4$ plasma. It has been found that the provisional of this additional treatment step further improves the performance of inkjet printed OTFT devices. It is postulated that in addition to restoring anti-wetting properties to exposed surfaces, the de-wetting treatment may also act to at least partially repair any damage to the channel region caused by the cleaning treatment step. Plasma dewetting treatment preferably lasts at least 10 seconds, more preferably at least 30 seconds.

For top gate OTFTs, a gate dielectric is deposited over the OSC and a gate electrode is deposited over the gate dielectric. However, preferably the OTFT is a bottom gate OTFT and the step of providing the substrate comprises depositing a gate electrode, depositing a gate dielectric over the gate electrode, and depositing the source and drain electrodes over the gate dielectric to form the channel region. It has been found that the cleaning treatment step is particularly effective for treating exposed dielectric material in the channel region of a bottom gate OTFT prior to inkjet printing of organic semiconductive material thereon. The dielectric material may be inorganic or organic but is preferably organic. Again, it has been found that the cleaning treatment step is particularly effective for treating exposed organic dielectric material in the channel region. It is believed that the cleaning treatment step may remove a contaminated top surface of the organic dielectric material.

For inkjet printed devices it is preferable to provide a well into which the organic semiconductive material can be deposited. Accordingly, after providing the substrate, and prior to the cleaning treatment step, it is advantageous to form a patterned layer of insulting material defining a well surrounding the channel region. This well forming step should be performed prior to the cleaning treatment step, in order to avoid contamination of the channel region after the cleaning step, and prior to inkjet printing of the organic semiconductive material. In fact, the cleaning treatment step of the present invention is particularly useful for devices in which a patterned layer of well defining material is provided as the process of forming such a patterned layer leads to contamination of the channel region and/or the source and drain electrodes which adversely affects the performance of such devices. The cleaning treatment step removes the contaminant material left in the channel region and on the electrodes after the well forming process.

According to a second aspect of the present invention there is provided an organic thin film transistor device manufactured according to the previously described methods, the device having a charge mobility of at least $10^{-4}$ cm$^2$/Vs, more preferably at least $10^{-3}$ cm$^2$/Vs, and most preferably at least $10^{-2}$ cm$^2$/Vs. Previous devices manufactured using inkjet printing without the cleaning treatment step of the present invention were found to have a charge mobility less than $10^{-4}$ cm$^2$/Vs.

According to other aspects of the present invention there is provided an active matrix organic optical device and method of making the same in which an organic thin film transistor manufactured according to the previously described methods is incorporated.

SUMMARY OF THE DRAWINGS

The present invention will now be described in further detail, by way of example only, with reference to the accompanying drawings in which.

DETAILED DESCRIPTION OF PREFERRED EMBODIMENTS

Embodiments of the present invention introduce an additional cleaning treatment step into the OTFT process flow for devices in which the OSC is deposited by inkjet printing. This has been found to yield good OTFT performance for inkjet printed devices including good wetting and film forming characteristics of the inkjet deposited OSC solution and high crystallinity, and thus high charge mobility, of the resultant OSC films.

Figure 5:
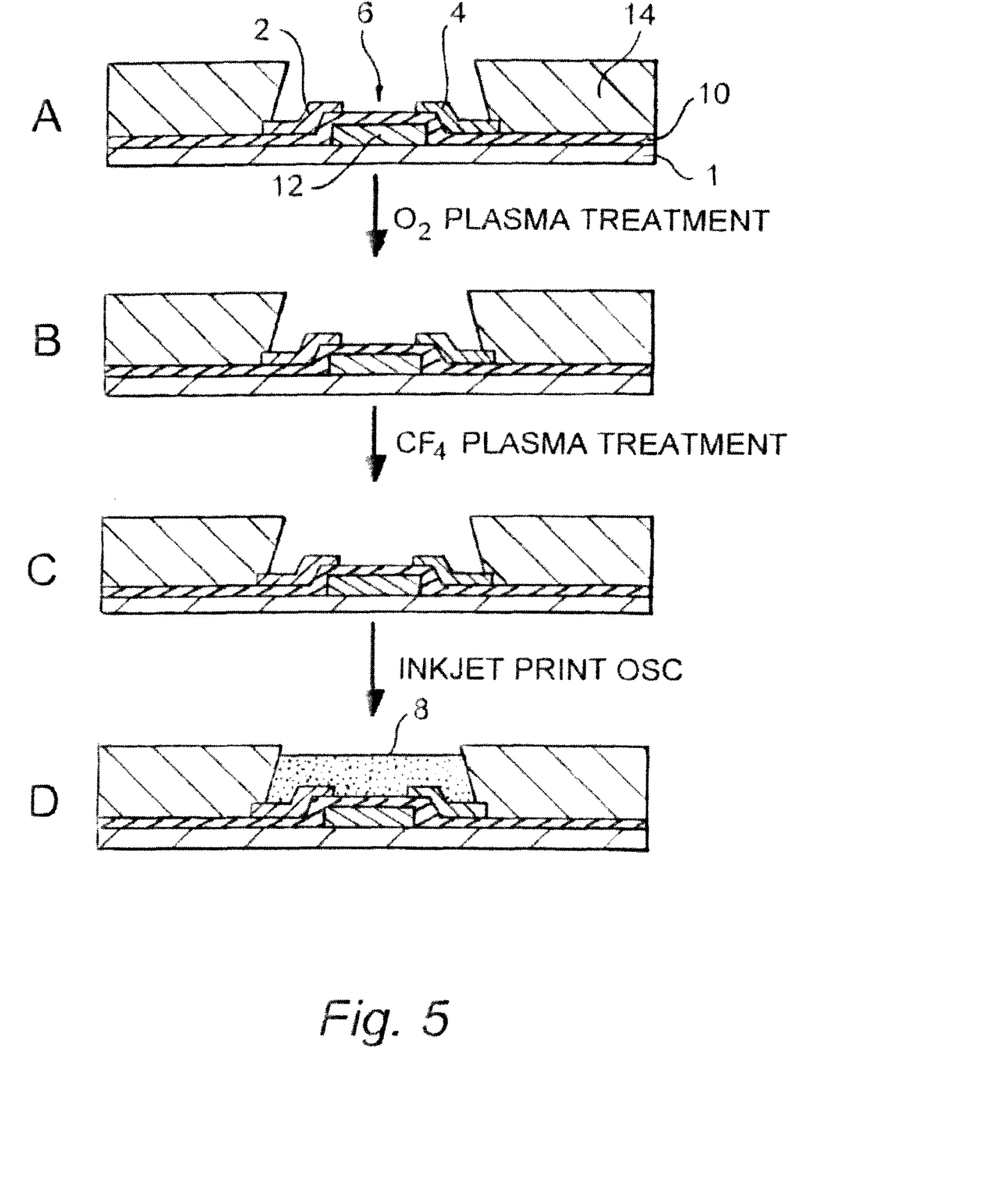
FIG. 5 illustrates the method steps involved in forming a bottom-gate organic thin film transistor according to an embodiment of the present invention.

FIG. 5 shows the method steps involved in forming a bottom-gate organic thin film transistor according to an embodiment of the present invention. Like reference numerals to those used in FIGS. 1 to 4 have been used for corresponding parts. FIG. 5(A) depicts the device structure under development prior to OSC deposition. This structure is formed by depositing a gate electrode 12 on a substrate 1, depositing a gate dielectric 10 over the gate electrode 12, depositing source and drain electrodes 2, 4 over the gate dielectric 10 defining a channel region 6 in which the gate dielectric 10 is exposed, and forming a patterned layer of insulating bank material 14 defining a well surrounding the channel region 6. In the arrangement illustrated in FIG. 5(A) the well-defining bank 14 has an undercut profile which can be beneficial for forming a good film of OSC when deposited in the well from solution. However, the well-defining bank may alternatively have a positive profile.

As shown in FIGS. 5(B) to 5(C), the dielectric 10 and the source and drain electrodes 2, 4 exposed in the well are subjected to an $O_2$ plasma treatment and then a $CF_4$ plasma treatment. OSC 8 is then inkjet printed into the well to form a structure as shown in FIG. 5(D).

Figure 6:
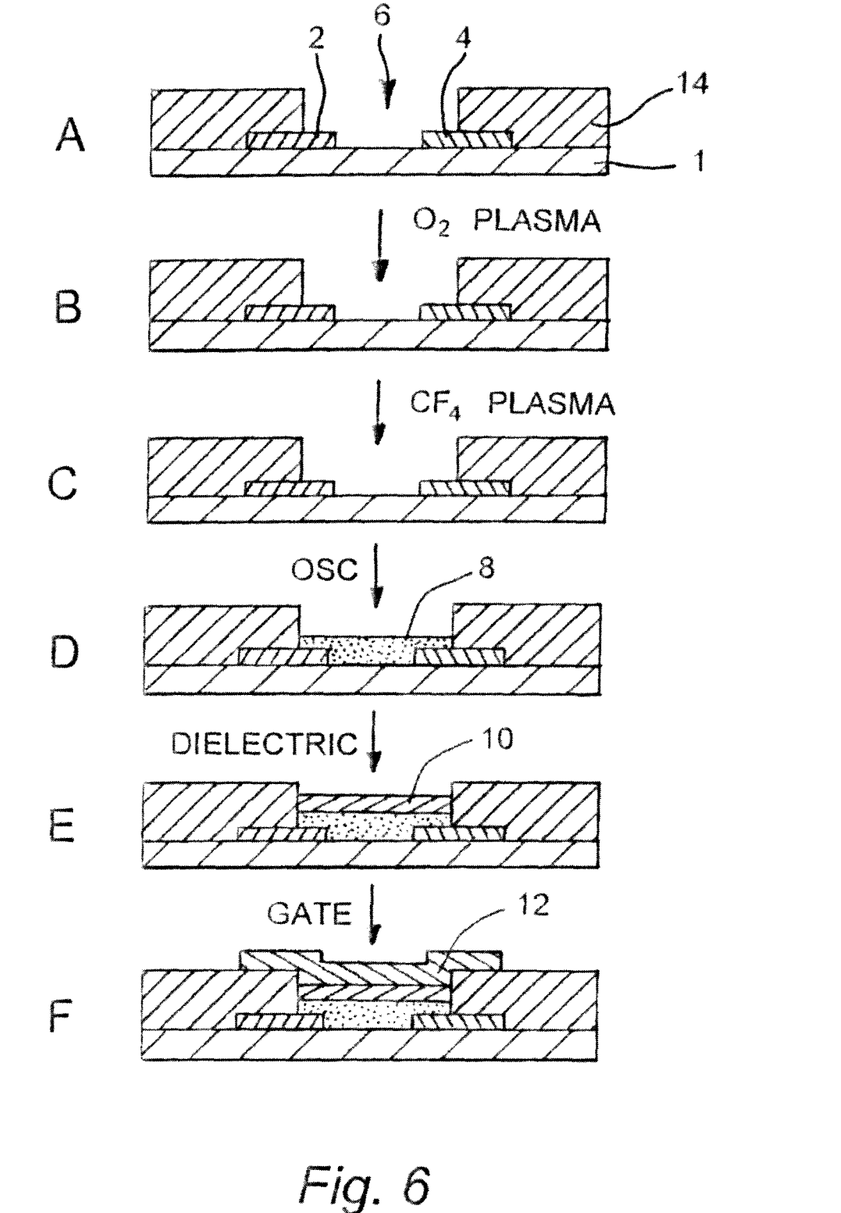
FIG. 6 illustrates the method steps involved in forming a top-gate organic thin film transistor according to an embodiment of the present invention.

FIG. 6 shows the corresponding method steps involved in forming a top-gate organic thin film transistor according to an embodiment of the present invention. Like reference numerals to those used in FIGS. 1 to 5 have been used for corresponding parts.

The method step are similar to those illustrated in FIG. 5 for the bottom gate arrangement except a different starting structure is used as shown in FIG. 6(A). Here, the substrate 1 is provided with source and drain electrodes 2, 4 defining the channel region 6, with the well-defining bank layer formed over the source and drain electrodes. This structure is then exposed to an $O_2$ plasma treatment and then a $CF_4$ plasma treatment as shown in FIGS. 6(B) to 6(C). OSC 8 is then inkjet printed into the well as shown in FIG. 6(D) followed by a gate dielectric 10 as shown in FIG. 6(E) and a gate electrode 12 to form a structure as shown in FIG. 6(F).

Materials and processes suitable for forming an OTFT in accordance with embodiments of the present invention are discussed in further detail below.

Substrate

The substrate may be rigid or flexible. Rigid substrates may be selected from glass or silicon and flexible substrates may comprise thin glass or plastics such as poly(ethylene-terephthalate) (PET), poly(ethylene-naphthalate) PEN, polycarbonate and polyimide.

The organic semiconductive material may be made solution processable through the use of a suitable solvent. Exemplary solvents include: mono- or poly-alkylbenzenes such as toluene and xylene; tetralin; and chloroform. Preferred solution deposition techniques include spin coating and ink jet printing. Other solution deposition techniques include dip-coating, roll printing and screen printing.

Organic Semiconductor Materials

Preferred organic semiconductor materials include: small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal, having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimization of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Gate Dielectric

The gate dielectric comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include Si02, SiNx and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, i.e. use of a solvent for deposition of the uppermost layer that does not dissolve the underlying layer; and crosslinking of the underlying layer.

The thickness of the gate dielectric layer is preferably less than 2 micrometres, more preferably less than 500 nm.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, e.g. octadecyltrichlorosilane. Similarly, the source and drain electrodes may be provided with a SAM to improve the contact between the organic semiconductor and the electrodes. For example, gold SD electrodes may be provided with a SAM comprising a thiol binding group and a group for improving the contact which may be a group having a high dipole moment; a dopant; or a conjugated moiety.

OTFT Applications

OTFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications.

Figure 7:
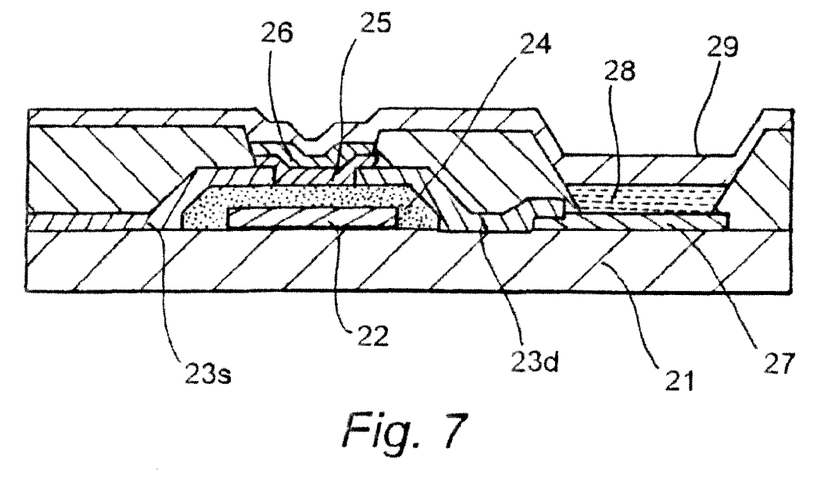
FIG. 7 illustrates a portion of an active matrix organic light emitting display comprising an organic thin film transistor and an organic light emitting device.

FIG. 7 shows a pixel comprising an organic thin film transistor and an adjacent organic light emitting device fabricated on a common substrate 21. The OTFT comprises gate electrode 22, dielectric layer 24, source and drain electrodes 23s and 23d respectively, and OSC layer 25. The OLED comprises anode 27, cathode 29 and an electroluminescent layer 28 provided between the anode and cathode. Further layers may be located between the anode and cathode, such as charge transporting, charge injecting or charge blocking layers. In the embodiment of FIG. 7, the layer of cathode material extends across both the OTFT and the OLED, and an insulating layer 26 is provided to electrically isolate the cathode layer 29 from the OSC layer 25. In this embodiment, the drain electrode 23d is directly connected to the anode of the organic light emitting device for switching the organic light emitting device between emitting and non-emitting states.

The active areas of the OTFT and the OLED are defined by a common bank material formed by depositing a layer of photoresist on substrate 21 and patterning it to define OTFT and OLED areas on the substrate. In accordance with an embodiment of the present invention the wells defining both the OTFT and the OLED can be exposed to a cleaning treatment step during manufacture in a manner analogous to that described in relation to FIGS. 5 and 6 prior to deposition of OSC and organic electroluminescent material therein. The remaining layers of the OTFT and OLED can then be deposited in the wells.

Figure 8:
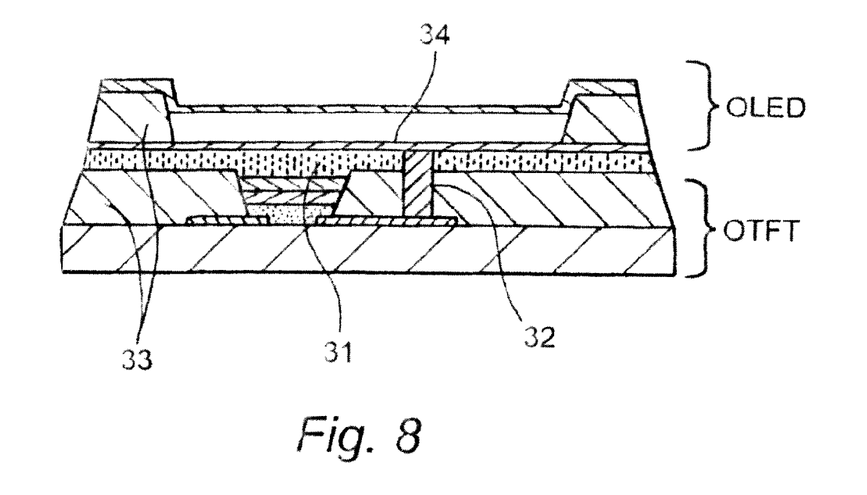
FIG. 8 illustrates a portion of another active matrix organic light emitting display arrangement comprising an organic thin film transistor and an organic light emitting device.

In an alternative arrangement illustrated in FIG. 8, an organic thin film transistor may be fabricated in a stacked relationship to an organic light emitting device. In such an embodiment, the organic thin film transistor is built up as described above in either a top or bottom gate configuration. As with the embodiment of FIG. 7, the active areas of the OTFT and OLED are defined by a patterned layer of photoresist 33, however in this stacked arrangement, there are two separate bank layers 33—one for the OLED and one for the OTFT. In accordance with an embodiment of the present invention these two separate layers can be treated in an analogous manner to that described in relation to FIGS. 5, 6 and 7 during manufacture.

A planarisation layer 31 (also known as a passivation layer) is deposited over the OTFT. Exemplary passivation layers include BCBs and parylenes. An organic light emitting device is fabricated over the passivation layer. The anode 34 of the organic light emitting device is electrically connected to the drain electrode of the organic thin film transistor by a conductive via 32 passing through passivation layer 31 and bank layer 33.

It will be appreciated that pixel circuits comprising an OTFT and an optically active area (e.g. light emitting or light sensing area) may comprise further elements. In particular, the OLED pixel circuits of FIGS. 7 and 8 will typically comprise least one further transistor in addition to the driving transistor shown, and at least one capacitor.

It will be appreciated that the organic light emitting devices described herein may be top or bottom-emitting devices. That is, the devices may emit light through either the anode or cathode side of the device. In a transparent device, both the anode and cathode are transparent. It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum.

Transparent cathodes are particularly advantageous for active matrix devices because emission through a transparent anode in such devices may be at least partially blocked by OTFT drive circuitry located underneath the emissive pixels as can be seen from the embodiment illustrated in FIG. 8.

EXAMPLES

An OTFT was manufactured according to the process illustrated in FIG. 5. Mobility of this device was at least 2 orders of magnitude higher than a corresponding device formed without oxygen plasma treatment.

Conversely, mobility of spin-coated devices fell by up to 2 orders of magnitude when subjected to oxygen and/or CF4 plasma treatment.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. A method of manufacturing an organic thin film transistor, comprising:
   providing a substrate comprising source and drain electrodes defining a channel region;
   subjecting at least the channel region to an oxygen plasma cleaning treatment; and
   depositing organic semiconductive material from solution into the channel region by inkjet printing, wherein the oxygen plasma cleaning treatment step is followed by a de-wetting treatment step prior to inkjet printing of the organic semiconductive material, wherein the organic thin film transistor is a bottom-gate device, wherein providing the substrate comprises depositing a gate electrode, depositing a gate dielectric over the gate electrode, and depositing the source and drain electrodes over the gate dielectric to form the channel region, and wherein the gate dielectric is exposed in the channel region during the oxygen plasma cleaning treatment step and the de-wetting treatment step.

2. A method according to claim 1, comprising exposing at least portions of the source and drain electrodes to the oxygen plasma cleaning treatment.

3. A method according to claim 1, wherein the oxygen plasma further comprises a radical promoting species.

4. A method according to claim 3, wherein the radical promoting species is a halogen containing species.

5. A method according to claim 4, wherein the halogen containing species is a fluorine containing species.

6. A method according to claim 5, wherein the fluorine containing species is $CF_4$.

7. A method according to claim 1, comprising performing the oxygen plasma cleaning treatment for at least 60 seconds.

8. A method according to claim 1, wherein the de-wetting treatment is a plasma treatment.

9. A method according to claim 8, wherein the de-wetting plasma treatment comprises a halogen containing plasma treatment.

10. A method according to claim 9, wherein the halogen containing plasma is a fluorine containing plasma.

11. A method according to claim 10, wherein the fluorine containing plasma is $CF_4$.

12. A method according to claim 1, wherein the dielectric material is an organic dielectric.

13. A method according to claim 1, further comprising forming a patterned layer of insulating material defining a well surrounding the channel region after providing the substrate, and prior to the oxygen plasma cleaning treatment step.

14. An organic thin film transistor device manufactured according to the method of claim 1, the device having a charge mobility of at least $10^{-4}$ cm$^2$/Vs.

15. An organic thin film transistor device according to claim 14, where the device has a charge mobility of at least $10^{-3}$ cm$^2$/Vs.

16. An organic thin film transistor device according to claim 15, where the device has a charge mobility of at least $10^{-2}$ cm$^2$/Vs.

17. A method of manufacturing an active matrix organic optical device comprising:
   forming, on a substrate comprising a patterned electrode layer, at least one bank layer defining a plurality of wells;
   subjecting the plurality of wells to an oxygen plasma cleaning treatment; and
   depositing organic semiconductive material by inkjet printing into some of the wells to form organic thin film transistors therein and organic optically active material into others of the wells to form light emissive pixels therein, wherein the oxygen plasma cleaning treatment step is followed by a de-wetting treatment step prior to inkjet printing of the organic semiconductive material and the organic optically active material, wherein the organic thin film transistor is a bottom-gate device, wherein the wells surround a channel region, the device comprising a gate electrode, a gate dielectric over the gate electrode, and source and drain electrodes over the gate dielectric, and wherein the gate dielectric is subjected to the oxygen plasma cleaning treatment and the de-wetting treatment.

18. A method according to claim 17, wherein forming at least one bank layer comprises forming a common bank layer provided for both the organic thin film transistors and the pixels on a common substrate and wherein subjecting the plurality of wells to a cleaning treatment comprises simultaneously subjecting both the wells for the organic thin film transistors and the wells for the pixels to the cleaning treatment.

19. A method according to claim 17, wherein the dielectric material is an organic dielectric.

20. An active matrix organic optical device manufactured according to the method of claim 17, wherein the organic thin film transistors have a charge mobility of at least $10^{-4}$ cm$^2$/Vs.

* * * * *